United States Patent
Rausch et al.

(10) Patent No.: US 12,222,484 B2
(45) Date of Patent: Feb. 11, 2025

(54) ILLUMINATION DEVICE FOR A CONFOCAL MICROSCOPE

(71) Applicant: TOPTICA Photonics AG, Gräfelfing (DE)

(72) Inventors: Christian Rausch, Unterhaching (DE); Alf Rieckmann, Munich (DE); Manfred Hager, Munich (DE); Jörg Lembach, Gauting (DE)

(73) Assignee: TOPTICA Photonics AG, Gräfelfing (DE)

(*) Notice: Subject to any disclaimer, the term of this patent is extended or adjusted under 35 U.S.C. 154(b) by 548 days.

(21) Appl. No.: 17/673,959

(22) Filed: Feb. 17, 2022

(65) Prior Publication Data

US 2022/0291493 A1  Sep. 15, 2022

(30) Foreign Application Priority Data

Feb. 18, 2021 (DE) .................... 10 2021 103 899.5

(51) Int. Cl.
   *G02B 21/00* (2006.01)
   *H05B 45/22* (2020.01)
   *H05B 45/32* (2020.01)

(52) U.S. Cl.
   CPC ......... *G02B 21/0032* (2013.01); *H05B 45/22* (2020.01); *H05B 45/32* (2020.01)

(58) Field of Classification Search
   CPC .... G02B 21/0032; H05B 45/22; H05B 45/32; H01S 5/0092; H01S 5/4012; H01S 5/4087

(Continued)

(56) References Cited

U.S. PATENT DOCUMENTS

| 7,995,271 B2* | 8/2011 | Kubo ................. G02B 21/0032 385/52 |
| 8,259,383 B2* | 9/2012 | Seyfried ............ G02B 21/0032 359/305 |

(Continued)

FOREIGN PATENT DOCUMENTS

| DE | 102007028337 | 12/2008 |
| DE | 102017108834 | 10/2018 |
| WO | WO 2015/136939 | 9/2015 |

OTHER PUBLICATIONS

Prüfungsantrag [Request for Examination] Dated Aug. 19, 2021 From the Deutsches Patent—und Markenamt [German Patent and Trademark Office] Re. Application No. 10 2021 103 899.5. (3 Pages).

*Primary Examiner* — Ryan Jager

(57) ABSTRACT

The invention relates to an illumination device, in particular for a confocal microscope. The object of the invention is to provide an illumination device which operates with a plurality of current-modulated semiconductor-based light sources, in which the light emission is as free as possible from distortions due to dynamic delays of the light emission in the output beam. To this end, the proposed illumination device comprises:
   two or more semiconductor-based light sources, in particular laser diodes, which are designed to emit light at different wavelengths,
   a combining unit, which is designed to combine the light emissions of the light sources into a single output light beam, and
   a driver unit connected to the light sources, which driver unit is designed to synthesise an operating current signal, which is supplied to each of the light sources, from at least one control signal, which specifies the temporal course of the light emission of each of the (Continued)

light sources, by means of digital signal processing, wherein the driver unit impresses a compensation signal on each of the operating current signals, which compensation signal at least partially compensates for a specific dynamic delay of the light emission of the particular light source.

10 Claims, 1 Drawing Sheet

(58) Field of Classification Search
USPC .......................................................... 315/291
See application file for complete search history.

(56) References Cited

U.S. PATENT DOCUMENTS

| | | | |
|---|---|---|---|
| 11,314,069 B2* | 4/2022 | Mrawek | G02B 21/0024 |
| 2001/0028031 A1* | 10/2001 | Engelhardt | G02B 27/283 |
| | | | 250/225 |
| 2008/0193081 A1* | 8/2008 | Hay | G02B 21/0032 |
| | | | 385/31 |
| 2009/0135476 A1* | 5/2009 | Araya | G02B 21/0032 |
| | | | 372/38.07 |
| 2010/0177375 A1* | 7/2010 | Seyfried | G02B 27/1006 |
| | | | 359/305 |
| 2020/0301122 A1* | 9/2020 | Mrawek | G02B 21/0084 |
| 2022/0291493 A1* | 9/2022 | Rausch | H05B 45/32 |

* cited by examiner

ILLUMINATION DEVICE FOR A CONFOCAL MICROSCOPE

RELATED APPLICATION

This application claims the benefit of priority of Germany Patent Application No. 10 2021 103 899.5 filed on Feb. 18, 2021, the contents of which are incorporated by reference as if fully set forth herein in their entirety.

FIELD AND BACKGROUND OF THE INVENTION

The invention relates to an illumination device, in particular for a confocal microscope, comprising two or more semiconductor-based light sources, in particular laser diodes, which are designed to emit light at different wavelengths, and a combining unit which is designed to combine the light emissions of the light sources into a single output light beam.

In a confocal microscope, the light from an illumination device is imaged into the microscoped specimen. From the illuminated point, light is focused through an objective onto a pinhole before it reaches a detector. The approximately point-shaped aperture of the pinhole and the illumination point in the specimen are confocal to each other (i.e. simultaneously in focus). Common confocal microscopes are reflected-light microscopes, in which the objective is used both for illumination and for detection. In a confocal microscope, therefore, the entire specimen is not illuminated, but only one point at any given time. The point-based illumination is scanned incrementally over the specimen. Thus, no complete image is formed in the microscope at any point in time. Instead, the light intensities of the light reflected or emitted by fluorescence from the location of the particular illuminated point are measured sequentially at a selection of positions of the area to be imaged, so that a subsequent reconstruction of an image is possible. For the specific excitation of different dyes in a preparation, an illumination device is used that provides light at different wavelengths. The choice of excitation wavelength depends on the absorption properties of the dyes to be examined. In the prior art, illumination devices are used that comprise various continuously emitting (cw) lasers (for example argon, argon-krypton, titanium-sapphire lasers). The illumination device has a combining unit (for example in the form of mirrors or beam splitters) for combining the light emissions of the various lasers into a single output light beam, which is supplied to the confocal microscope to illuminate the specimen. The illumination device receives a control signal from the electronics of the confocal microscope, via which it requests light with—corresponding to the high scanning speed of modern confocal microscopes—a wavelength and intensity that change in rapid succession. In the illumination device, the selection of the desired wavelengths and the adjustment of the intensity of the light at the required wavelength are carried out on the basis of the control signal, for example by using an acousto-optical tunable filter (AOTF, see for example DE 10 2007 028 337 A1). Such filters and the associated control electronics represent a considerable cost factor.

It is also known to use light-emitting diodes or laser diodes, that is to say semiconductor-based light sources that emit at different wavelengths, in illumination devices for confocal microscopes. If necessary, some of the light sources are operated in combination with non-linear frequency conversion (for example frequency doubling) to make certain wavelengths available. In such illumination devices, the light sources are directly current-modulated individually to achieve time-controlled emission of light of a specific wavelength and intensity in the output beam of the illumination device. A major disadvantage of direct current modulation, that is to say of the non-continuous operation of the semiconductor light sources, is that the current modulation results in a temperature modulation of the semiconductor crystal due to the power dissipation converted into heat, which in turn results in a specific dynamic delay of the light emission relative to the operating current signal applied to the particular light source. At high modulation frequencies, a modulation of the refractive index takes place in the semiconductor of the particular light source due to the change of the charge carrier density. This effect also causes a specific deviation of the light emission from the operating current signal on short time scales (for example in the microsecond range). The time constants of the thermally induced dynamic delay are typically larger (for example in the millisecond to second range). This can mean, for example, that the intensity of the light emission after switching on the operating current signal is initially below (or also above) a target value assigned to the specified operating current and then approaches the target value asymptotically over a certain period of time, i.e. with a delay. In the case of combining the light sources in the lighting device with non-linear frequency converters, the dynamic behaviour of the light emission caused by these thermal effects can be even more complex. These dynamic effects have a negative influence on confocal microscopy, especially against the background of the high scanning speed of today's devices. Precise and fast control of the illumination in terms of intensity is of decisive importance for the image quality achieved.

US 2009/0135476 A1 describes a light source device comprising semiconductor laser elements that emit laser light in accordance with a supplied current signal, as well as a light receiving element that receives the laser light emitted from the semiconductor laser element, and a controller that controls the light emission of the semiconductor laser element. Here, the controller comprises a first semiconductor laser element driver circuit that outputs a current signal to the semiconductor laser elements according to a command signal, and a second semiconductor laser element driver circuit that adjusts the current signal based on the amount of light of the laser light received by the light receiving element. An isolating circuit is further provided, which switches between the first and second semiconductor laser element driver circuit in accordance with a command signal.

DE 10 2017 108 834 A1 discloses a confocal microscope with an illumination system for illuminating a sample chamber in which a sample is located. The illumination system has a control device with illumination parameters that can be changed by user interaction. The control device also has trigger outputs, to each of which an externally triggerable laser system can be connected. A trigger generator generates temporally successive trigger signals, with which the laser systems connected to the trigger outputs are triggered. The assignment of the trigger signals to the trigger outputs and/or a time interval between successive trigger signals is dependent on the illumination parameters. Due to the variable generation and assignment of the trigger signals, the laser systems can be controlled as desired and adapted to a very wide variety of measuring tasks.

WO 2015/136939 A1 describes a device for measuring Raman scattering. The device comprises a light generator configured so as to generate a first continuous light and a second continuous light, the wavelengths of which are different from each other, a pulse generator configured so as to generate a first optical pulse and a second optical pulse from the first continuous light and the second continuous light, respectively, and a light detector configured so as to detect light if which the intensity is modulated by Raman scattering which is generated by focusing the first and second optical pulses on a sample. The pulse generator is configured to generate the first optical pulse and the second optical pulse such that a repetition frequency of the second optical pulse coincides with an integer multiple of a repetition frequency of the first optical pulse.

SUMMARY OF THE INVENTION

Against this background, it is the object of the invention to provide an illumination device which operates with a plurality of current-modulated semiconductor-based light sources, in which the light emission is as free as possible from distortions due to dynamic delays of the light emission in the output beam.

The invention achieves the object by means of an illumination device, in particular for a confocal microscope, comprising

- two or more semiconductor-based light sources, in particular laser diodes, which are designed to emit light at different wavelengths,
- a combining unit, which is designed to combine the light emissions of the light sources into a single output light beam, and
- a driver unit connected to the light sources, which driver unit is designed to synthesise an operating current signal, which is supplied to each of the light sources, from at least one control signal, which specifies the temporal course of the light emission of each of the light sources, by means of digital signal processing, wherein the driver unit impresses a compensation signal on each of the operating current signals, which compensation signal at least partially compensates for a specific dynamic delay of the light emission of the particular light source, wherein the driver unit is designed to generate the compensation signal on the basis of a parameterisation stored beforehand in the driver unit and assigned to the particular light source.

The approach of the invention consists in subjecting the operating current to a "pre-distortion" during the current modulation of the semiconductor light sources on the basis of the externally supplied control signal, in such a way that the above-mentioned specific dynamic delays of the individual light sources are compensated. For this purpose, a driver unit is used that "knows" the specific dynamic behaviour of the individual light sources of the lighting device and on this basis synthesises operating current signals, the temporal course of which is derived from the control signal and on each of which a suitable compensation signal is additionally impressed so that the temporal course of the light emission in the output beam deviates as little as possible from the request by the control signal with regard to the intensity. With this approach, it can be assumed that the dynamic, especially thermal behaviour of the individual light sources as such, i.e. the parameters that determine the specific dynamic delay of the individual light sources, change only slowly. Therefore, it is sufficient to parameterise the driver unit accordingly only once during production of the lighting device. During operation of the lighting device, the parameterisation stored in the driver unit can then be accessed in order to compensate sufficiently well for the specific dynamic deviations of the individual light sources. In this respect, the compensation according to the invention is explicitly not based on a control of the light emission. A detection/measurement of the light emission "in situ", in order to derive therefrom an error signal for a control, for example, expressly does not take place during regular operation of the lighting device according to the invention.

In particular, the invention allows the required predistortion of the operating current signals, i.e. the compensation signals in the sense of the invention, to be automatically calculated by a one-time time-resolved measurement of the light emission of the individual light sources (possibly in combination with non-linear frequency converters) during the production of the lighting device. The compensation can then be performed during operation with high accuracy by digital synthesis of the operating current signals. For this purpose, digital signal processing can be used, for example, for convolution of the control signal waveform with the predistortion signal waveform specifically determined for the light source in question. As an alternative to the time-resolved measurement of the light emission during parameterisation, a measurement of the frequency response of the transfer function is possible, which reflects the frequency-dependent ratio of light emission and operating current of the individual light sources.

It has been shown in practice that the specific dynamic delay of the light emission of the individual light sources during switch-on processes is often given approximately by a superimposition of one or more exponential functions (exponential saturation functions) with different time constants in each case. In this case, from the time of switch-on with a correspondingly exponential temporal course, the light emission approaches an equilibrium intensity at which the temperature of the semiconductor crystal has stabilised. Accordingly, in a possible realisation of the invention, the course of the compensation signal can be a superimposition of one or more temporally decreasing exponential functions, wherein each of the exponential functions is assigned a different time constant and a different (positive or negative) pre-factor. The pre-factor in this case indicates the amplitude, i.e. the weighting of the particular exponential function in the compensation signal. The various time constants and pre-factors are stored as parameters in the driver unit. The dynamic delay behaviour can be dependent on the working point, i.e. dependent on the particular intensity of the light emission. The driver unit according to the invention can also reliably compensate for such a variable dynamic delay behaviour by storing working point-dependent parameters for the synthesis of the compensation signal in the driver unit. The parameters are determined, as described above, at the time of production of the lighting device by measuring the specific dynamic behaviour.

It should be noted that the synthesis of the compensation signal is not limited to a superimposition of exponential functions. Any mathematical function suitable for modelling the specific dynamic delay behaviour of the individual light sources can be used in principle. It is decisive that according to the invention the compensation signal is digitally generated, i.e. synthesised, on the basis of a parameterisation determined beforehand and stored in the driver unit. For this purpose, the driver unit expediently comprises an FPGA or an ASIC or, depending on the performance requirements, a microcontroller, which generates the required digital signals on the basis of the control signal.

In a practical implementation, the driver unit may comprise a multi-channel driver circuit, wherein each light source is assigned a channel, and wherein each channel comprises at least one digital-to-analogue converter that converts a digital signal generated by means of the FPGA/ASIC/microcontroller into the analogue operating current signal supplied to the particular light source. Each channel can optionally be assigned several digital-to-analogue converters, the output signals of which are added together and thus form the operating current signal. Such driver circuits, which enable precise operating current modulation of a plurality of semiconductor light sources connected on the output side on the basis of digital signals supplied on the input side, are advantageously commercially available. With such a driver circuit, the lighting device according to the invention can be realised economically.

In one possible embodiment of the lighting device, at least one light sensor is provided which detects the light emitted by the light sources, wherein the driver unit is connected to the light sensor and is designed to derive the compensation signals associated with the individual light sources in a calibration mode (i.e. outside the regular operation of the lighting device) from a transient signal of the light sensor. In this embodiment, the specific dynamic delay behaviour of the individual light sources can be measured in order to perform a "recalibration" of the driver unit on this basis, for example at certain time intervals, if the dynamic behaviour of the individual light sources changes over time, for example due to ageing. In other words, the parameters that determine the specific dynamic delay of the individual light sources are re-measured by means of the integrated light sensor and the driver unit is re-parameterised accordingly. This ensures that the compensation signal generated compensates the specific dynamic delay of the light emission of each individual light source appropriately, even over longer periods of time.

It should be noted that the synthesis of the operating current signals according to the invention cannot only be used to compensate for the specific dynamic delay behaviour of the individual light sources. It is conceivable that optical components are located in the beam path in front of or behind the combining unit, for example as components of the used confocal microscope, which optical components also exhibit a dynamic behaviour that leads to an undesired temporal variation of the light intensity. Such dynamic processes can also be measured and included in the parameterisation of the driver unit for generating the compensation signal. Thus, the lighting device according to the invention can be used advantageously to compensate for such "external" dynamic processes as well and to ensure precise temporal control of the light intensity at the actual point of interaction of the application.

The illumination device according to the invention is particularly suitable for confocal laser scanning microscopes (also known as laser scanning microscopes), in which the specimen being examined is scanned line by line at high speed, i.e. at high pixel frequency. In most cases, the fluorescence of certain dyes used as markers is detected in a spatially resolved manner. The light sources of the illumination device in this case are preferably laser diodes, optionally in combination with optical amplifiers and/or non-linear frequency converters.

BRIEF DESCRIPTION OF THE SEVERAL VIEWS OF THE DRAWINGS

Exemplary embodiments of the invention are explained in greater detail below with reference to the drawings, in which.

DESCRIPTION OF SPECIFIC EMBODIMENTS OF THE INVENTION

Figure 1:
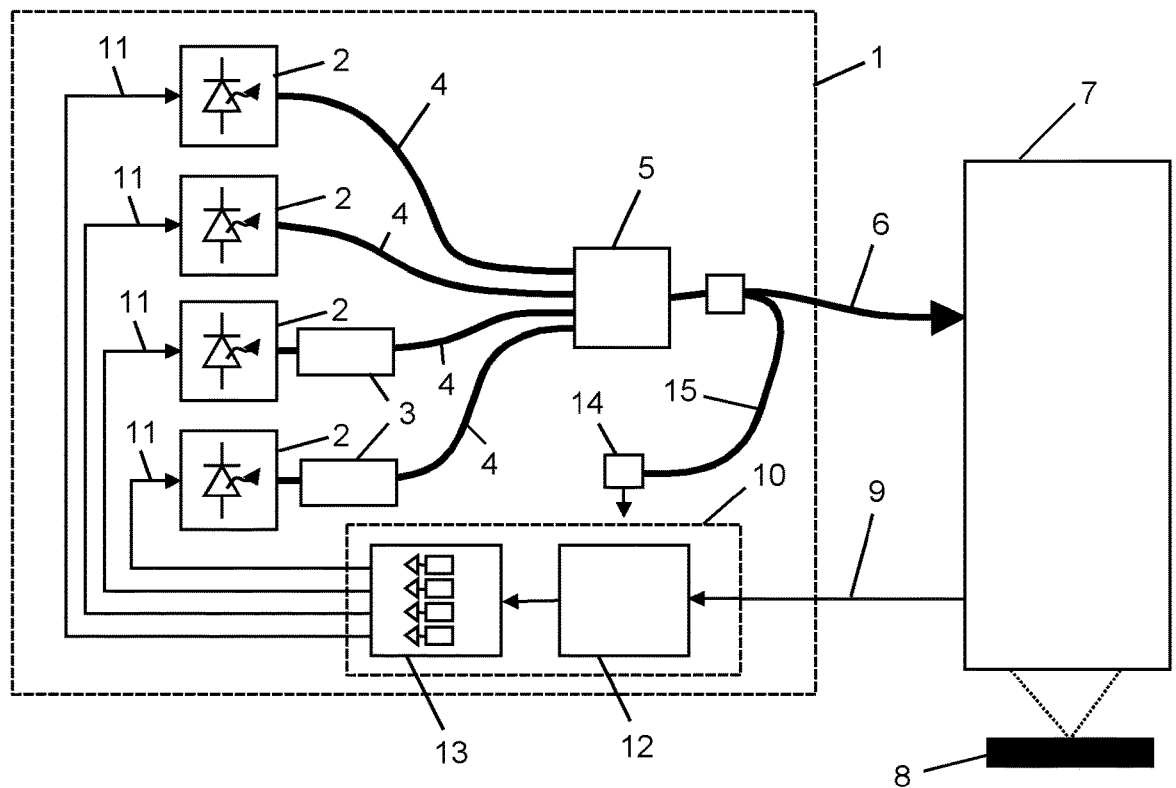
FIG. 1 shows a schematic representation of a lighting device according to the invention as a block diagram.

FIG. 1 shows a schematic representation of an illumination device designated on the whole by reference numeral 1. In the exemplary embodiment, this device comprises a total of four laser diodes 2 as light sources, which emit light at different wavelengths. Two laser diodes 2 are each followed by a non-linear frequency doubler 3. The laser diodes 2, or the frequency doublers 3, are coupled to light-conducting fibres 4, which feed the emitted light to a combining unit 5 (here a fibre combiner, although a free-beam combining technique would also be conceivable). The combining unit 5 combines the (possibly frequency-converted) light emissions of the light sources 2 into a single output light beam, which is fed via another fibre 6 to a confocal microscope 7 to illuminate a specimen 8.

A control electronics (not shown) of the confocal microscope 7 generates a control signal 9 which is fed to the illumination device 1 to request light of a specific wavelength and a specific intensity in each case. The control signal thus specifies the temporal course of the light emission of each individual light source 2 with regard to the temporal sequence of switch-on and switch-off processes and with regard to the emission intensity. A driver unit 10 of the lighting device 1 synthesises an operating current signal 11 supplied to the light sources 2 in each case on the basis of the control signal 9, so that the light sources emit in a time-modulated manner in accordance with the control signal 9. In the process, the driver unit 10 impresses a compensation signal on each of the operating current signals 11, which compensation signal at least partially compensates for a specific dynamic delay of the light emission of the particular light source 2. This is explained in more detail below with reference to FIG. 2.

For the required digital signal processing, the driver unit 10 contains an FPGA or a microcontroller 12, in the data memory of which there are stored parameters that define the compensation signals assigned to the individual light sources 2. These parameters are calculated at the time of production of the lighting device 1 on the basis of a measurement of the dynamic behaviour of each individual light source 2. During operation of the lighting device 1, the software of the FPGA/microcontroller 12 accesses the stored parameters in order to compensate for the specific dynamic deviations in each case by means of corresponding "pre-distorted" energisation of the light sources 2.

In the exemplary embodiment, the driver unit 10 comprises a multi-channel driver circuit 13, in which a channel is assigned to each light source 2, and wherein each channel comprises one or more digital-to-analogue converters with a downstream current amplifier, which converts a digital signal generated by means of the FPGA/microcontroller 12 into the analogue operating current signal 11 supplied to the particular light source 2.

Furthermore, a light sensor 14 is provided in the exemplary embodiment. A portion of the output light is supplied to the light sensor 14 via a fibre 15. The driver unit 10 is connected to the light sensor 14. The driver unit 10 is thus able to detect the dynamic delay behaviour of the light sources 2, for example for the purpose of a recalibration carried out as required or at certain time intervals (for example within the scope of maintenance), on the basis of the transient signal of the light sensor 14 and on this basis to suitably readjust the parameters determining the compensation signal. For this purpose, the driver unit 10 can use the FPGA/microcontroller 12, for example, to automatically optimise the parameters in such a way that the difference between the detected temporal course of the light emission with the course requested according to the control signal 9 is minimised.

Figure 2:
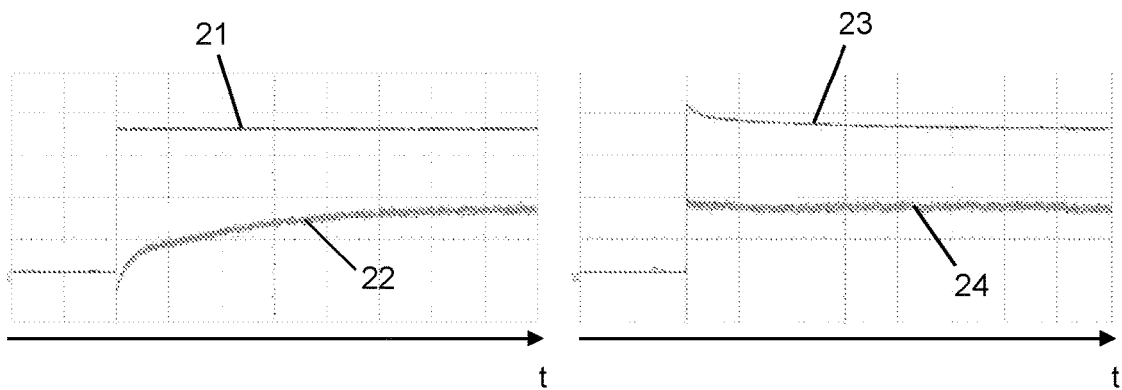
FIG. 2 shows an illustration of the dynamic delay of the light emission of a laser diode and the compensation according to the invention.

The two graphs in FIG. 2 illustrate the effect of the described digital pre-distortion of the operating current signals. The curve 21 of the left graph shows the temporal course of the operating current signal 11 of one of the light sources 2 without compensation according to the invention. The operating current signal 11 has an almost perfectly rectangular shape. However, the output power of the corresponding light source 2 (curve 22) does not follow this course, and instead shows a dynamic delay (lagging of the power) in the form of an exponential saturation curve with several time constants. These lie in a range from below one millisecond to several seconds. The power of the light source 2 reaches only about 65% immediately when it is switched on and only reaches its full power after several seconds. In the right-hand graph, a compensation signal is impressed on the operating current signal 11 (curve 23) in accordance with the invention, i.e. the current supplied to the light source 2 is pre-distorted in the above sense. The compensation signal is a superimposition of temporally decreasing exponential functions with the corresponding time constants and pre-factors in order to keep the course of the output power of the light source 2 (curve 24) as constant as possible over the entire time range.

What is claimed is:

1. An illumination device, in particular for a confocal microscope, comprising
    two or more semiconductor-based light sources, in particular laser diodes, which are designed to emit light at different wavelengths,
    a combining unit, which is designed to combine the light emissions of the light sources into a single output light beam, and
    a driver unit connected to the light sources, which driver unit is designed to synthesise an operating current signal supplied to the light sources by digital signal processing from at least one control signal, which specifies the temporal course of the light emission of each of the light sources, wherein the driver unit impresses a compensation signal on each of the operating current signals, which compensation signal at least partially compensates for a specific dynamic delay of the light emission of the particular light source, wherein the driver unit is designed to generate the compensation signal on the basis of a parameterisation stored beforehand in the drive unit and assigned to the particular light source.

2. The device according to claim 1, wherein the control signal specifies the temporal course of the light emission of each individual light source with regard to the temporal sequence of switch-on and switch-off processes and with regard to the emission intensity.

3. The device according to claim 1, wherein the temporal course of the compensation signal is based on a mathematical function that models the specific dynamic delay of the light emission as a function of time.

4. The device according to claim 3, wherein the course of the compensation signal is a superimposition of one or more temporally decreasing exponential functions, wherein each of the exponential functions is assigned a different time constant and a different pre-factor.

5. The device according to claim 1, wherein the compensation signal additionally compensates for dynamic behaviour, influencing the light intensity, of optical components which are located in the beam path in front of or behind the combining unit.

6. The device according to claim 1, wherein the compensation signal is dependent on the working point of the particular light source.

7. The device according to claim 1, wherein the driver unit comprises a multi-channel driver circuit, wherein each light source is assigned a channel, and wherein each channel comprises one or more digital-to-analogue converters which convert a digital signal generated by means of an FPGA, ASIC or microcontroller into the analogue operating current signal supplied to the particular light source.

8. The device according to claim 1, wherein at least one light sensor is provided which detects the light emitted by the light sources, wherein the driver unit is connected to the light sensor and is designed to derive the compensation signals assigned to the individual light sources in a calibration mode from a transient signal of the light sensor.

9. The device according to claim 1, wherein at least one of the light sources is assigned a non-linear frequency converter in the beam path between the light source and the combining unit, which non-linear frequency converter converts the light emitted by the light source in respect of the frequency.

10. A confocal microscope, in particular laser scanning microscope, comprising an illumination device according to claim 1.

* * * * *